(12) United States Patent
Kinghorn et al.

(10) Patent No.: US 11,765,835 B2
(45) Date of Patent: Sep. 19, 2023

(54) CIRCUIT BOARD ASSEMBLY

(71) Applicant: Leonardo UK Ltd, London (GB)

(72) Inventors: Anthony Kinghorn, Basildon Essex (GB); Paul Thompson, Basildon Essex (GB); Michael Dugan, Basildon Essex (GB)

(73) Assignee: LEONARDO UK LTD, London (GB)

( * ) Notice: Subject to any disclaimer, the term of this patent is extended or adjusted under 35 U.S.C. 154(b) by 38 days.

(21) Appl. No.: 17/631,536

(22) PCT Filed: Jul. 28, 2020

(86) PCT No.: PCT/EP2020/071252
§ 371 (c)(1),
(2) Date: Jan. 31, 2022

(87) PCT Pub. No.: WO2021/018885
PCT Pub. Date: Feb. 4, 2021

(65) Prior Publication Data
US 2022/0272846 A1 Aug. 25, 2022

(30) Foreign Application Priority Data
Jul. 29, 2019 (GB) ..................................... 1910805

(51) Int. Cl.
*H05K 3/00* (2006.01)
*H05K 1/02* (2006.01)
*H05K 1/14* (2006.01)

(52) U.S. Cl.
CPC ......... *H05K 3/0061* (2013.01); *H05K 1/0207* (2013.01); *H05K 1/144* (2013.01); *H05K 2201/066* (2013.01)

(58) Field of Classification Search
CPC .... H05K 3/0061; H05K 1/0207; H05K 1/144; H05K 2201/066
See application file for complete search history.

(56) References Cited

U.S. PATENT DOCUMENTS 3,818,122 A 6/1974 Luetzow
5,101,322 A 3/1992 Ghaem et al.
(Continued)

FOREIGN PATENT DOCUMENTS

DE 29622097 U1 2/1997
DE 102013212990 A1 1/2015
(Continued)

OTHER PUBLICATIONS

Great Britain Search Report dated Jan. 18, 2021 by the United Kingdom Intellectual Property Office in corresponding Great Britain Application No. 2011674.5. (7 pages).
(Continued)

*Primary Examiner* — Pete T Lee
(74) *Attorney, Agent, or Firm* — BUCHANAN INGERSOLL & ROONEY PC

(57) ABSTRACT

A radar system includes two circuit boards, a first carries an array of antenna elements and the second carries power circuitry to power the circuitry of the first board. To provide adequate cooling whilst minimising the size of the system the two circuit boards are mounted in a sandwich arrangement on opposite sides of a heat sink. Data and power connections between the two boards are provided by a plurality of electrical cables that extend through apertures in the heat sink.

14 Claims, 5 Drawing Sheets

(56) References Cited

U.S. PATENT DOCUMENTS

| | | | |
|---|---|---|---|
| 6,028,770 | A | 2/2000 | Kerner et al. |
| 6,055,157 | A | 4/2000 | Bartilson |
| 6,510,053 | B1 | 1/2003 | Azar |
| 9,402,303 | B2 | 7/2016 | Qian et al. |
| 10,104,774 | B2 * | 10/2018 | Matsuda ................ H05K 1/028 |
| 10,856,419 | B2 * | 12/2020 | Loibl ..................... H05K 1/147 |
| 2004/0212965 | A1 | 10/2004 | Ishii et al. |
| 2004/0218367 | A1 | 11/2004 | Lin et al. |
| 2007/0159380 | A1 | 7/2007 | Nagaishi et al. |
| 2007/0246191 | A1 | 10/2007 | Behrens et al. |
| 2016/0345423 | A1 * | 11/2016 | Pyper .................... H05K 1/021 |
| 2018/0013938 | A1 | 1/2018 | Choi et al. |

FOREIGN PATENT DOCUMENTS

| | | | |
|---|---|---|---|
| EP | 0844808 | A2 | 5/1998 |
| JP | 2001-111262 | A | 4/2001 |
| JP | 2007-116217 | A | 5/2007 |
| WO | 2018/111460 | A1 | 6/2018 |
| WO | 2018133893 | A1 | 7/2018 |
| WO | 2021018885 | A1 | 2/2021 |

OTHER PUBLICATIONS

International Search Report (PCT/ISA/210) and Written Opinion (PCT/ISA/237) dated May 25, 2021, by the European Patent Office as the International Searching Authority for International Application No. PCT/EP2020/075898. (16 pages).

International Search Report (PCT/ISA/210) and Written Opinion (PCT/ISA/237) dated Oct. 26, 2020, by the European Patent Office as the International Searching Authority for International Application No. PCT/EP2020/071252. (16 pages).

Search Report "Heat Exchanger Sandwich", Search-a-patent, Mar. 11, 2019. (2 pages).

Office Action (Notice of Reasons for Refusal) dated Feb. 14, 2023, by the Japan Patent Office in corresponding Japanese Patent Application No. 2022-506543 and an English translation of the Office Action. (6 pages).

* cited by examiner

CIRCUIT BOARD ASSEMBLY

The present invention relates to a circuit board assembly particularly but not exclusively for a radar system.

U.S. Pat. No. 6,510,053 describes a circuit board assembly in which a thermally conductive element is sandwiched between two circuit boards in order to draw away and dissipate heat from said boards. The thermally conductive element may be profiled with recesses or apertures in order to conform to the topography of the circuit board.

EP0844808 likewise describes a sandwich arrangement of a heat sink between two circuit boards. The heat sink comprises a closed channel for the passage of a coolant to provide improved cooling function.

U.S. Pat. Nos. 9,402,303, 3,818,122 and WO2018133893 describe flexible printed circuit interconnecting cables that include longitudinal slits between pairs of conductors.

According to the invention there is provided a circuit board assembly comprising two circuit boards and a heat sink arranged to sink heat away from the two circuit boards; the heat sink lying between and in contact with both of the two circuit boards; characterised in that system comprises an electrical cable that extends through an aperture in the heat sink to provide electrical connection between the two circuit boards.

The invention allows for electrical connection between the boards without connectors external to the heat sink. This enclosed sandwich arrangement is compact lending itself for use in radar systems that need to be mounted where space is limited, such as for example, in the nose of an aircraft.

Where implemented in a radar system comprising an electronic scanned phased array, a first of the two circuit boards may carry circuitry that provides an array of antenna elements of an electronically scanned array, and a second of the two circuit boards carries power circuitry used to power the circuitry on the first circuit board. The first board may also carry transmit and/or receive modules arranged to amplify and/or phase shift signals to be transmitted by and/or received from the antenna array. The second board may also carry control circuitry to control operation of the transmit and/or receive modules.

The electrical cable may provide a data connection between the two circuit boards, a power connection between the two circuit boards or both.

The assembly may comprise multiple electrical cables each providing an electrical connection between the first and second circuit boards. Each cable may extend through a different aperture within the heat sink.

Such an arrangement is especially advantageous where the invention is implemented in an electronic scanned phased array radar system where it would be impracticable to run data connections associated with each array element of the antenna through a single aperture as the antenna array elements are widely spaced about the board.

Where this is so a difficulty arises in aligning each of the connectors of the cables with the corresponding connectors on the circuit board. One solution is to provide electrical cables that are long enough that the connector of each cable can be mated with its corresponding connector on the circuit board. The difficult then arises of trying to fold each of the cables so that they can be retained within the heatsink. More favourably shorter electrical cables are used but this then does not provide for manual access to all of the connectors. To ameliorate this difficulty it is preferable that at least one of the board connectors of each cable is retained to the heat sink in a floating arrangement to allow the connector of the electrical cable to move across the face of the circuit board whilst restricting movement of the connector in directions perpendicular to said face. With this arrangement, when the second board is seated onto the heat sink and pressure applied to mate the connectors of the cable and board together, the connectors of the electrical cables can move in order to self align with the corresponding connectors on the second board. This permits the two boards to be blind-mated through the heat-sink.

It is favourable that the electrical cable are flexible and in one embodiment the or each may comprise conductive traces formed on a flexible (e.g. film) substrate.

The flexible substrate may comprise multiple slits, each lying between different adjacent conductive traces. The provision of the slits effectively creates multiple narrow parallel cables which can flex independently to the others. This provides the electrical cable within increased flexibility in an axis that lies in the principle plane of the flexible film substrate and that is perpendicular to the longitudinal axis of the cable.

The electrical cable may comprise a board connector for making electrical connection with a corresponding connector provided on a face of one of the two circuit boards.

Favourably the electrical cable comprises two board connectors for connection to both boards. The board connector(s) are favourably mounted on the flexible film substrate.

The board connector may mounted to the heat sink though a connection that allows the board connector to move relative to the heat sink in orthogonal directions lying in a plane parallel or coincident with the face of the circuit board.

The circuit board assembly may comprises a fastener that passes through an aperture of the electrical cable to retain the cable to the heat sink; and a spacer bearing arranged between the fastener and the cable, the spacer bearing lying, at least in part, within the aperture of the electrical cable. The presence of the spacer bearing avoids the electrical cable from being pressed against the heat sink in a manner that would inhibit its freedom to move.

The heat sink may comprise an internal channel that provides a pathway for a coolant fluid to cool the heat exchanger. This allows for an increased capacity for cooling.

The invention will now be described by way of example with reference to the following Figures in which:

FIGS. 1-3 illustrate a circuit board assembly 1 comprising a heat sink 2 that is sandwiched between first and second printed circuit boards (PCB) 3, 4.

The heat sink 2 is comprised from a material, typically a metal, having high heat conductance; aluminium and copper are suitable examples. In one preferred embodiment the heat sink comprises a solid block of metal such as one or more of aluminium, copper or titanium.

The heat sink 2 may be comprised from a cast, braised or machined piece. Alternatively it may be made through an additive manufacture process.

The heat sink 2 has faces 2A 2B on opposite sides of the heat sink 2. Faces 2A, 2B lie in direct contact with respective inner facing sides 3A, 4A of PCBs 3, 4 to provide good thermal connection to the PCBs 3, 4. Faces 2A 2B are profiled to provide a pattern of recesses that correspond in shape and position to the components, e.g. microchips and other discreet electronic components, that are mounted to the respective sides 3A 4A of the PCBs 3,4. This increases the contact area with the PCBs 3,4 or at least allows the heat sink 2 to more closely surround the heat generating components on the PCBs to improve heat transfer from the PCBs 3,4 to the heat sink 2.

Figure 3:
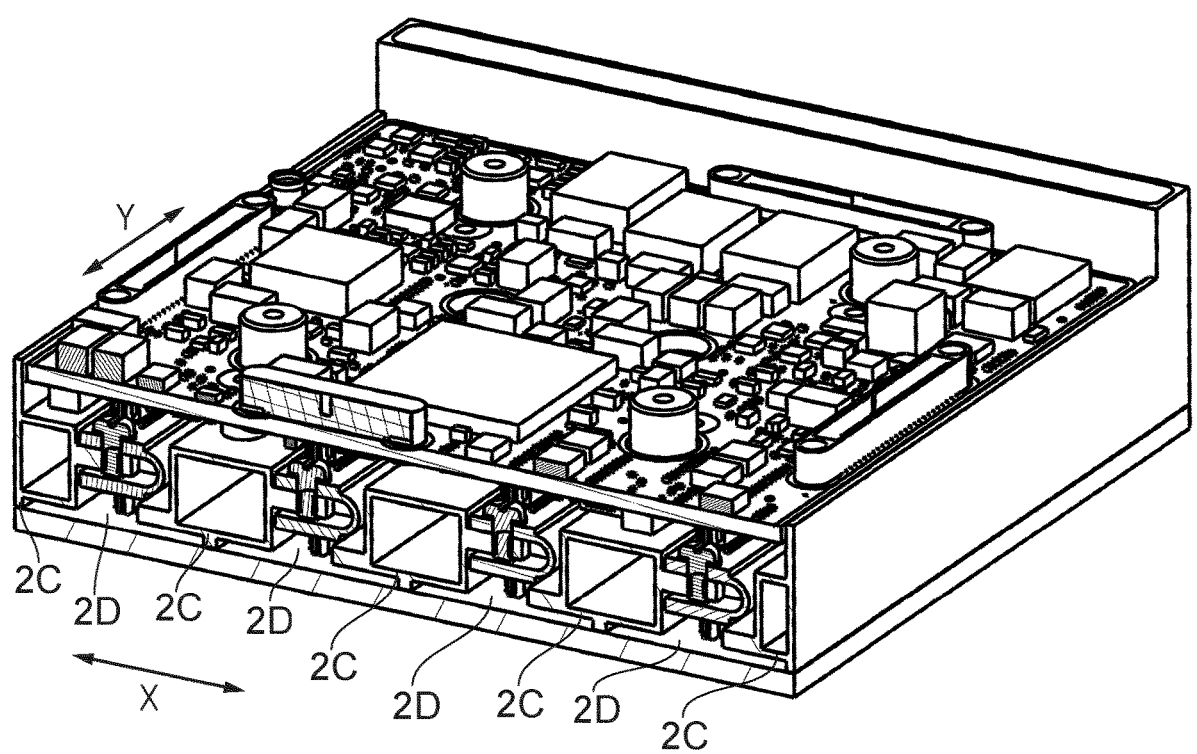
FIG. 3 is a side cross-section view showing cooling channels within the heat sink and flexible electrical connectors that extend through the heat sink to connect the printed circuit boards together.

The heat sink 2 defines internal channels 2C, visible in FIG. 3, that provides a pathway, e.g. a circuitous pathway, for a coolant fluid, such as air or water, to flow through the heat sink 2. This provides means to increase the rate at which heat can be dissipated from the heat sink 2.

The internal channels 2C may be connected into a coolant system (not shown) comprising, for example, a pump or fan to move the coolant fluid (liquid and/or gas) through the heat sink 2, and optionally also through a heat exchanger which is separate from the heat sink 2 to cool the coolant. The coolant system will generally be of conventional form and so further details of its structure and operation will not be described further.

Figure 5:
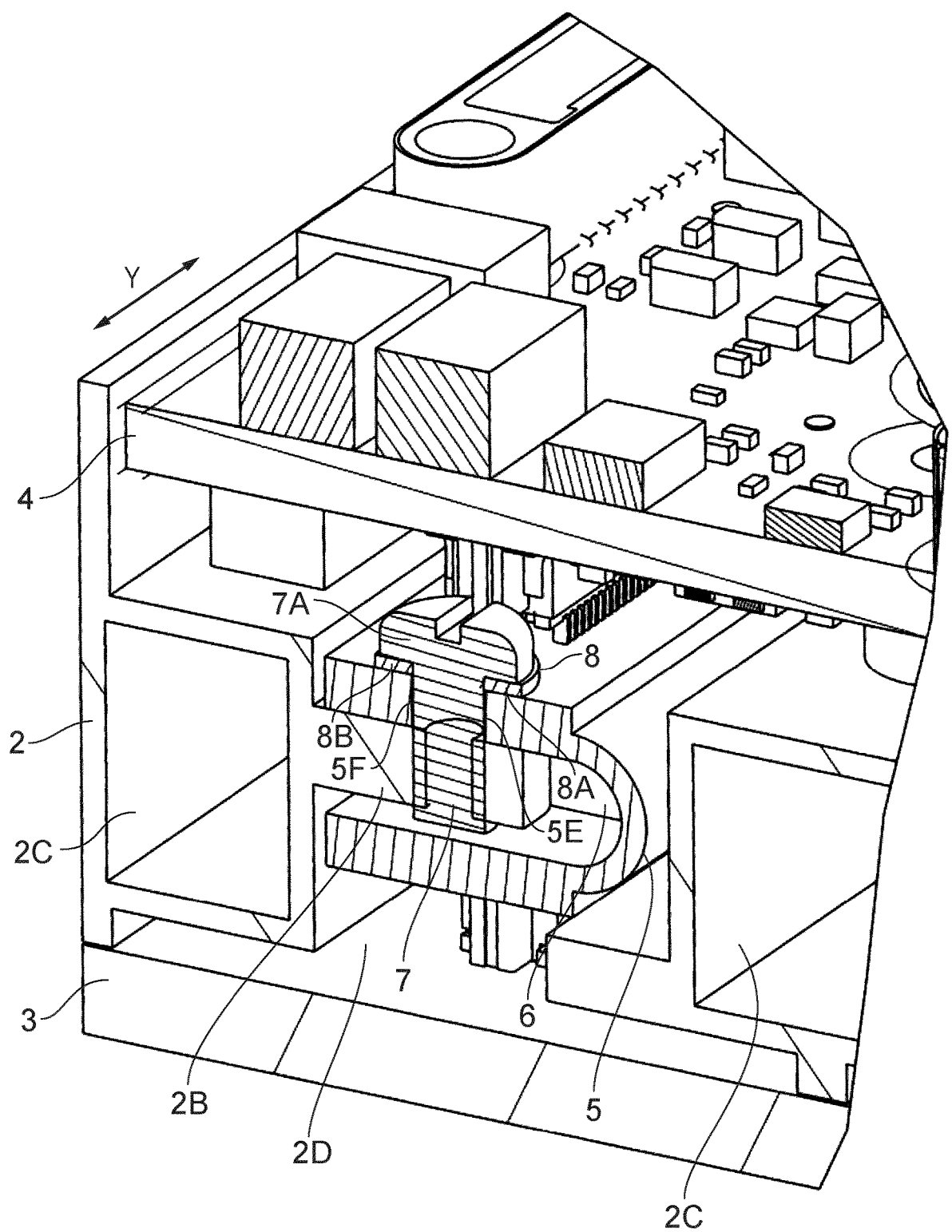
FIG. 5 is an enlargement of a portion of FIG. 3 illustrating how the flexible electrical connector is retained to the heat sink such to allow movement of the cable connector to compensate for misalignment with the complementary connector on the printed circuit board.

The heat sink 2 comprises a number of (in this example eight though the number may vary) further internal channels 2D, see FIGS. 3 & 5, that extend through the heat sink 2 between the first and second PCBs 3,4.

The further internal channels 2D provide conduits for interconnecting cables 5 (in this example eight cables, one per channel 2D, though the number may vary) that connect between the first and second PCBs 3,4. Each cable 5 may provide a power or data connection between the PCBs 3,4 or both power and data connections.

Figure 4:
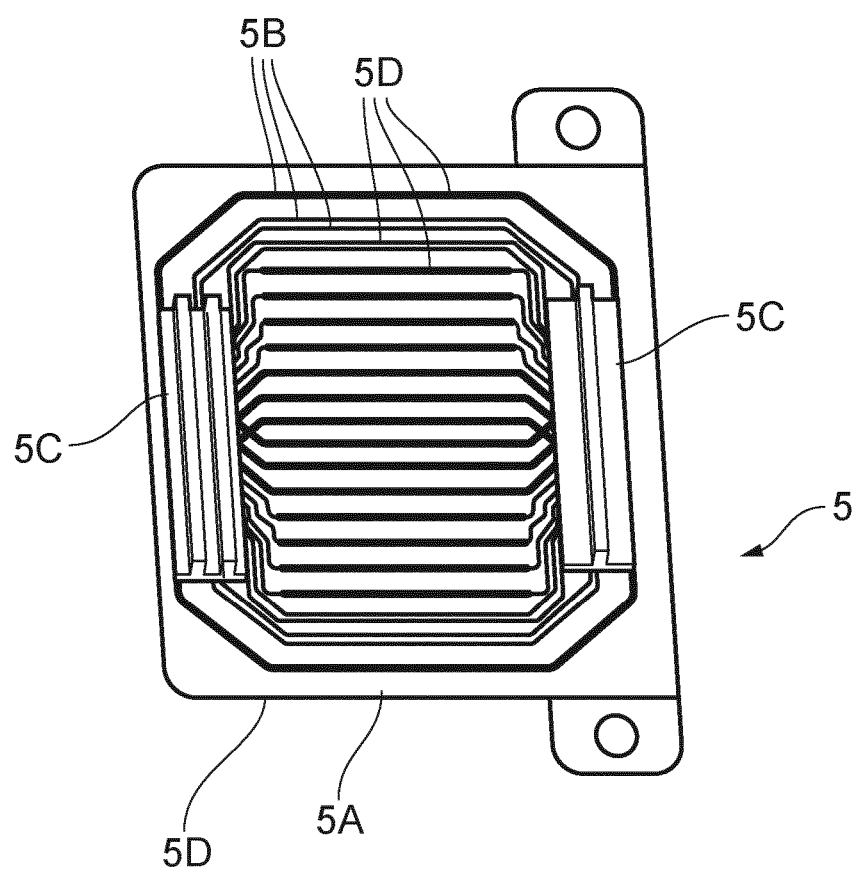
FIG. 4 is a perspective view of one of the flexible electrical connectors.

With reference to FIG. 4, each cable 5 is comprised from a flexible film substrate 5A (e.g. of a electrically insulating polymer material) on which is printed, or otherwise disposed, a plurality of parallel electrically conductive traces 5B that extend and connect between terminals of board connectors 5C (header or socket) mounted at opposite ends of the film substrate 5A. Each trace provides a single data or power connection. Each board connector 5C is arranged to mate with a corresponding board connector 3B, mounted on respective PCB 3,4.

The flexible film substrate 5A allows for relative movement between the board connectors 5C to compensate for misalignment between the connectors 3B 4B of the respective PCB 3,4 in the X axis of the inner faces 3A 4A shown in FIG. 3. However the width of the film substrate 5A means greater force is required to move the board connectors 5C through the Y axis of the inner faces 3A 4A. Where the film substrate 5A carries many traces, the width of the substrate 5A may be such that the force required to move the conductor in the Y axis is too great to allow for blind-mating without applying a degree of force that could risk damaging the PCBs 3,4 or connectors 5.

To address this, the flexible film substrate 5A is provided with multiple slits 5D. Each slit 5D lies between parallel traces 5B and extends parallel with the traces 5B for a majority of their length. The slits 5D effectively create a series of narrow parallel cables, each carrying one or more conductive traces 5B, which can flex independently to the others and each more readily in the Y axis. This makes the cable 5 as a whole more flexible in the Y axis allowing for increased relative movement between the board connectors 5C.

The flexibility of the film substrate 5A and the provision of the slits 5D provide for relative movement of the board-to-board connector 5C to compensate for any misalignment between the connectors of the PCB's 3,4 in either X or Y axis about the face of the boards 3A 4A.

Figure 1:
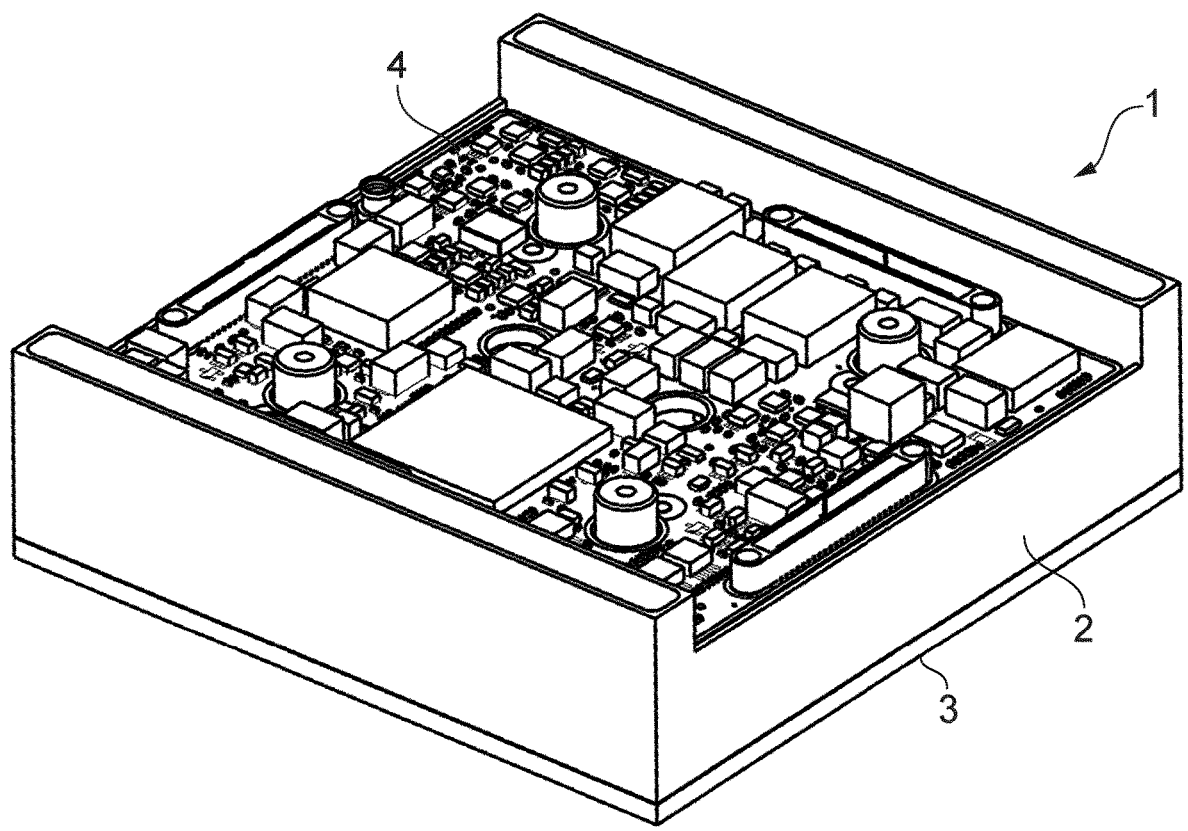
FIG. 1 is a perspective view of a circuit board assembly comprising a heat sink arranged in a sandwich configuration between two printed circuit boards.
Figure 2:
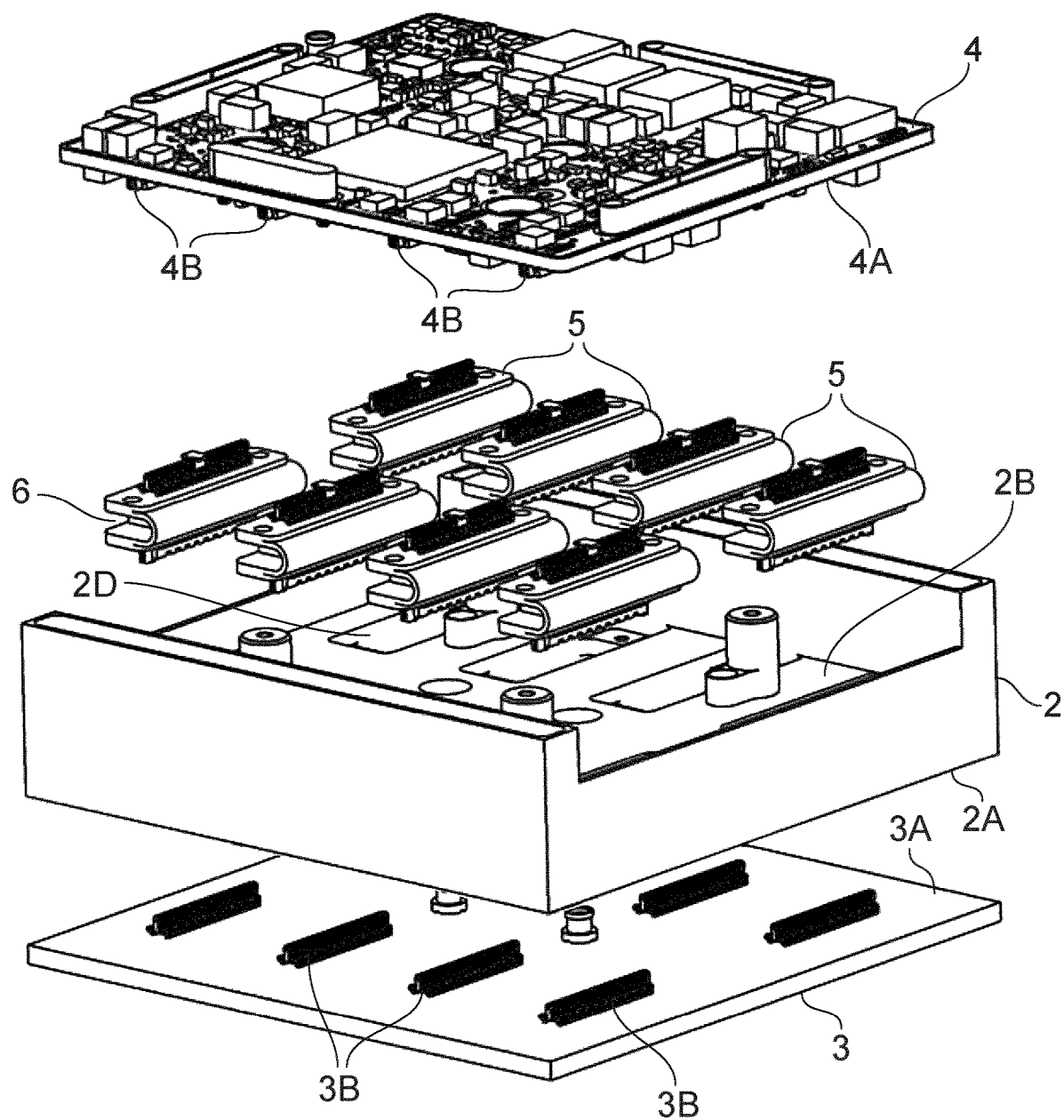
FIG. 2 is an exploded perspective view of the circuit board assembly of FIG. 1.

As can be seen most clearly in FIGS. 2 & 5, when assembled, each cable 5 is folded over itself with board connectors 5C (header or socket) facing outwardly in opposite directions for connection to their counterparts 3B,4B on boards 3,4.

A spacer 6 is arranged directly between the board connectors 5C which acts to provide a minimum separation distance between board connectors 5C of the same cable 5.

With reference to FIG. 5, the cable 5 comprises, at one end, at least one aperture 5E about which the end of the cable 5 is retained to the heat sink 2 by means of a fastener 7, e.g. a threaded fastener. The fastener 7 passes through the aperture 5E to fix to a portion 2B of the heat sink 2 that protrudes into the space between the board connectors of the folded over cable 5.

There is further provided a bearing spacer 8 that is retained between the fastener 7 and the cable 5. The bearing spacer 8 has a narrower portion 8A that lies within the aperture 5E of the flexible substrate 5A and a broader portion 8B sandwiched between a head 7A of the fastener and the cable 5. The spacing between the broader portion 8B and the heat sink 2, within which the cable 5 lies, and which is dictated by the height of the narrower portion 8A, is set to inhibit movement of the cable at its fastening point, and thus also of the board connector 5A proximate the fastener 7, away from the heat sink 2 whilst still allowing relative movement in the X and Y axes.

The narrower portion 8A is narrower than the aperture 5E, such as to provide free space 9 between wall 5F of cable 5 facing the aperture 5E and the narrower portion 8A.

Through this arrangement one of the board connectors 5C of each cable 5 is held in a floating configuration, confined in the direction normal to face 4A of the second board 4, but free to move relative to the fastener, and thus about the X and Y axis in order to allow alignment with the PCB's connectors 4B.

To assemble, one end of each cable 5 is retained to heat sink 2 using fasteners 7 as described above. The board connectors 5A at each of the free ends of the cable 5, i.e. the ends not mounted to the heat sink 2, are individually mated to their corresponding connector 3B on the first board 3. The heat sink 2 and first board 3 are brought together and affixed with fasteners and/or heat conductive bonding adhesive, e.g. heat conductive epoxy.

The second board 4 is brought against the other side of the heat sink 2 (or vice-versa) so that the exposed board connectors 5C within the apertures 2D are substantially aligned with the corresponding connectors 4B on the second board 4. The floating character of the board connectors 5C allow the board connectors 5C to move laterally across the connector 4B in response to force applied to bring the connector 5C 4B together to compensate for any initial misalignment between the two to ensure the two connector mate together correctly. This ability to blind-mate the connectors 5C 4B makes it possible to mate multiple board connectors 5C to the second board 3 simultaneous using short board connectors 5.

It would be possible to connect both ends of each cable 5 to the heat sink 2 using the fasteners 7 and spacing bearing 8 arrangement described earlier. Nevertheless this is considered unnecessary as through the afore described method the board connectors 5C at the free ends of the cables 5 can be manipulated individually by virtue of the flexibility of the cable 5 and mated to the first board 3 before the first board 3 and heat sink 2 are bonded together. This contrasts when subsequently bonding the second board 4 to the heat sink 2 because unless the cables 5 are very much longer than apertures 2D (which would be difficult to house within the apertures 2D, it is difficult to manipulate multiple cable connectors 5C whilst simultaneously mounting the second board 4.

In an example application the circuit board assembly 1 forms part of a radar system. The first PCB 3 carries circuitry that provides an array of antenna elements of an electronically scanned array, said elements provided on an outer facing (i.e. facing away from the heat sink 2) surface 3C of the first PCB 3. The first PCB 3 also carries transmit and/or receive modules that amplify and/or change the phase and/or timing of signals to be transmitted and/or have been received from the antenna elements.

The second PCB 4 carries power circuitry used to power the circuitry on the first PCB 3, as well as higher level control circuitry for controlling the transmit and/or receive modules.

The cables 5 act to carry both control signals from the higher level control circuitry to the transmit and/or receive modules and also power from the power circuitry on the second PCB 4 to the circuitry of the first PCB 3.

It will be appreciated that the second board 4 may instead carry the antenna elements and transmit/receive modulated and the first board 3 carries the power circuitry and the higher level control circuitry.

The sandwich arrangement of the circuit boards and heat sink 2 provides a compact arrangement which is advantageous where the radar system is to be mounted where space is limited such as, for example, in the nose of an aerial platform, e.g. an aeroplane or helicopter.

The invention claimed is:

1. A circuit board assembly comprising:
    two circuit boards;
    a heat sink arranged to sink heat away from the two circuit boards; the heat sink lying between and in contact with both of the two circuit boards; and
    an electrical cable that extends through an aperture in the heat sink to provide electrical connection between the two circuit boards; wherein the electrical cable includes multiple wires provided, at least in part, by conductive traces formed on a flexible substrate and wherein the flexible substrate is provided with multiple parallel slits such that the flexible substrate includes multiple parallel strips each carrying at least a portion of one or more of the conductive traces.

2. A circuit system according to claim 1, wherein the electrical cable provides a data connection between the two circuit boards.

3. A circuit board assembly according to claim 1, wherein the electrical cable is configured to provide a power connection between the two circuit boards.

4. A circuit board assembly according to claim 1, wherein the electrical cable comprises:
    a board connector for making electrical connection with a corresponding connector provided on a face of one of the two circuit boards; and wherein the board connector is mounted to the heat sink though a connection that is configured to allow the board connector to move relative to the heat sink in orthogonal directions lying in a plane parallel or coincident with the face of the circuit board.

5. A circuit board assembly according to claim 4, comprising:
    a fastener that passes through an aperture of the electrical cable to retain the cable to the heat sink; and
    a spacer bearing arranged between the fastener and the cable, the spacer bearing lying, at least in part, within the aperture of the electrical cable.

6. A circuit board assembly according to claim 1, wherein the heat sink comprises:
    an internal channel that provides a pathway for a coolant fluid to cool the heat exchanger.

7. A circuit board assembly according to claim 1, comprising:
    multiple of the electrical cables, each of the electrical cables providing an electrical connection between the first and second circuit boards; and each electrical cable extending through a different aperture within the heat sink.

8. A circuit board assembly according to claim 1, wherein a first of the two circuit boards includes circuitry that provides an array of antenna elements of a electronically scanned array, and wherein a second of the two circuit board includes circuitry used to power the circuitry on the first circuit board.

9. A circuit board assembly according to claim 2, wherein the electrical cable is configured to provide a power connection between the two circuit boards.

10. A circuit board assembly according to claim 9, wherein the electrical cable comprises:
    a board connector for making electrical connection with a corresponding connector provided on a face of one of the two circuit boards; and wherein the board connector is mounted to the heat sink though a connection that is configured to allow the board connector to move relative to the heat sink in orthogonal directions lying in a plane parallel or coincident with the face of the circuit board.

11. A circuit board assembly according to claim 10, comprising:
    a fastener that passes through an aperture of the electrical cable to retain the cable to the heat sink; and
    a spacer bearing arranged between the fastener and the cable, the spacer bearing lying, at least in part, within the aperture of the electrical cable.

12. A circuit board assembly according to claim 11, wherein the heat sink comprises:
    an internal channel that provides a pathway for a coolant fluid to cool the heat exchanger.

13. A circuit board assembly according to claim 12, comprising:
    multiple of the electrical cables, each of the electrical cables providing an electrical connection between the first and second circuit boards; and each electrical cable extending through a different aperture within the heat sink.

14. A circuit board assembly according to claim 13, wherein a first of the two circuit boards includes circuitry that provides an array of antenna elements of a electronically scanned array, and wherein a second of the two circuit board includes power circuitry used to power the circuitry on the first circuit board.

* * * * *